United States Patent [19]

Lowry

[11] 4,301,462
[45] Nov. 17, 1981

[54] LIGHT ACTIVATED SILICON SWITCH WITH ETCHED CHANNEL IN CATHODE BASE AND ANODE EMITTER COMMUNICATING WITH CLADDED OPTICAL FIBER

[75] Inventor: Lewis R. Lowry, Greensburg, Pa.

[73] Assignee: Westinghouse Electric Corp., Pittsburgh, Pa.

[21] Appl. No.: 930,762

[22] Filed: Aug. 3, 1978

[51] Int. Cl.³ .......................................... H01L 27/14
[52] U.S. Cl. ...................................... 357/30; 357/38; 357/55; 350/96.17; 350/96.19
[58] Field of Search .......................... 357/30, 38, 55; 350/96.15, 96.17, 96.19

[56] References Cited

U.S. PATENT DOCUMENTS

| | | | |
|---|---|---|---|
| 3,590,344 | 6/1971 | Roberts et al. | 357/38 |
| 3,994,559 | 11/1976 | Crow | 350/96.17 |
| 4,059,338 | 11/1977 | Hartelius | 350/96.17 |
| 4,097,118 | 6/1978 | Hammer | 350/96.17 |
| 4,110,781 | 8/1978 | Konishi et al. | 357/39 |
| 4,128,759 | 12/1978 | Hunt et al. | 350/96.15 |
| 4,135,783 | 1/1979 | Kunze | 350/96.17 |
| 4,219,833 | 8/1980 | Temple | 357/38 |

FOREIGN PATENT DOCUMENTS 1254634  11/1971  United Kingdom ................ 357/38

*Primary Examiner*—Joseph E. Clawson, Jr.
*Attorney, Agent, or Firm*—C. L. Menzemer

[57] ABSTRACT

A light activated silicon switch (LASS) is disclosed in which light is transmitted from a light trigger source to target areas prepared in the cathode-base and anode-emitter regions of the silicon wafer. These target areas are V-shaped channels etched in the silicon wafer. Light transmitting conduits, each consisting of a central core of light transmissive material, with an outer cladding, are arranged to transmit the light energy to the respective target areas. The cladding is removed at one end of each conduit for optically coupling the light to the proximate target area, while the other end of the conduit is adapted to receive a light trigger signal of appropriate wave length.

5 Claims, 6 Drawing Figures

LIGHT ACTIVATED SILICON SWITCH WITH ETCHED CHANNEL IN CATHODE BASE AND ANODE EMITTER COMMUNICATING WITH CLADDED OPTICAL FIBER

CROSS REFERENCE TO RELATED APPLICATION

See the copending application for "Improved Light Activated Silicon Switch", Ser. No. 932,992 now U.S. Pat. No. 4,186,409 (W.E. 47,701) filed on Aug. 11, 1978 in the name of Paul G. McMullin and assigned to the same assignee as the present invention.

BACKGROUND OF THE INVENTION

1. Field of the Invention

This invention relates generally to a semiconductor device and particularly to a four region light activated silicon switch (LASS).

2. Description of the Prior Art

In order to actuate a LASS, a large amount of light must be delivered to the proper regions within the wafer of semiconductor material comprising the semiconductor device. To accomplish this it has been the practice to direct a beam of light on to at least one surface of the silicon wafer. Typically, the beam is sent in a perpendicular direction to the wafer surface or at Brewster's angle in order to minimize the surface reflection loss.

There are some rather severe disadvantages with these prior art techniques for light coupling to the LASS. Typically, the light is introduced through a central aperture, or one or more rectangular slots arranged in the cathode electrode. Thus the light is introduced into a relatively compact area. It is characteristic of the LASS that current conduction spreads slowly from the region initially turned on as determined by the area exposed to light. Thus, it takes a relatively long time for conduction to spread from the turned on area to cover the entire useful area of the device.

From the illuminated or turned on area, the shortest electrical path is in a direction toward the aperture in the cathode electrode, but obviously, since the aperture presents no electrical contact, the path to the cathode electrode must be longer. Thus much of the initial current passes through long, relatively high resistance paths in the silicon before it can enter the metal cathode electrode or contact surrounding the aperture. This high resistance causes rapid heating at the beginning of current flow, and limits the amount of current that can be tolerated without device failure.

Further, with the single aperture, or the one or more rectangular slots in the cathode electrode, the heat generated in the silicon wafer in the area where the light impinges must seek a longer thermal path to the cathode electrode surrounding in the aperture. There is of course still a thermal path to an anode electrode which also serves as a heat sink. As a result, thermal considerations place an upper limit on the starting current capacity for the device.

A typical prior art device is described in British Pat. No. 1,254,634 for "Improved Thyristor Arrangement" invented by Boksjo et al. In this patent the thyristor is turned on by a controlled illumination which is applied normal to the semiconductor body through windows arranged in both the anode and cathode sides of the LASS.

SUMMARY OF THE INVENTION

An improved light activated silicon switch is provided comprising a silicon wafer with cathode-emitter, cathode-base, anode-base and anode-emitter regions. A plurality of optical targets are provided, each target comprising a channel cut in the cathode-base region. A plurality of light transmitting conduits are provided, each conduit having two end portions and comprising a central core of light transmitting material surrounded by a cladding, the cladding being removed at one end portion for optically communicating with said channel, the other end portion being adapted to receive a light trigger from a source. Anode and cathode electrodes are affixed to said anode and cathode emitter regions.

The optical targets, 1 to 10 in number, are V-shaped channels which occupy less than 25% of the surface area of the cathode-base region.

The central core is of a material having a higher index of refraction than the cladding, so that the transmitted light is confined to the central core until it reaches the area of the target.

In a second embodiment, the light is introduced into both sides of the silicon wafer, a plurality of additional optical targets, 1 to 10 in number, being arranged as V-shaped channels in the anode-emitter region. A plurality of identical light transmitting conduits are also provided, each conduit having two end portions, one end portion optically communicating with a channel, the other end portion being adapted to receive the light trigger, respectively.

DESCRIPTION OF THE PREFERRED EMBODIMENT

Figure 1:
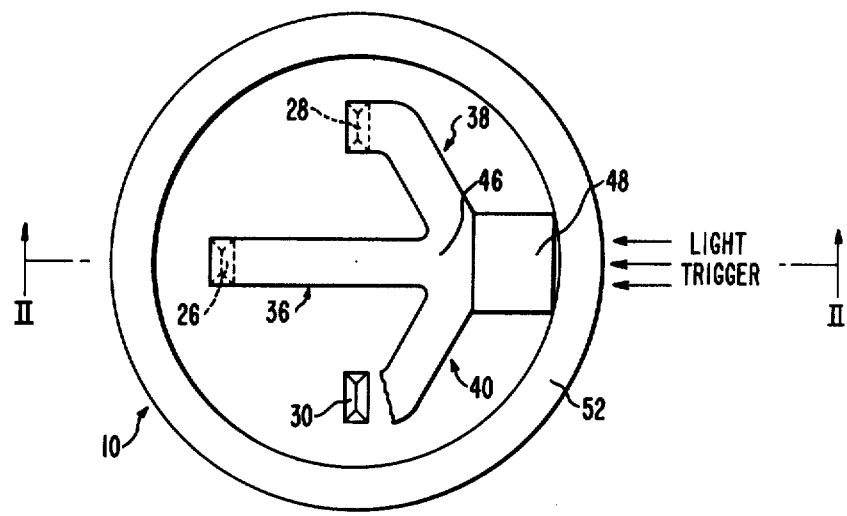
FIG. 1 is a top plan view of the light activated switch (LASS) with the metalization removed in order to show the light transmitting conduits.
Figure 2:
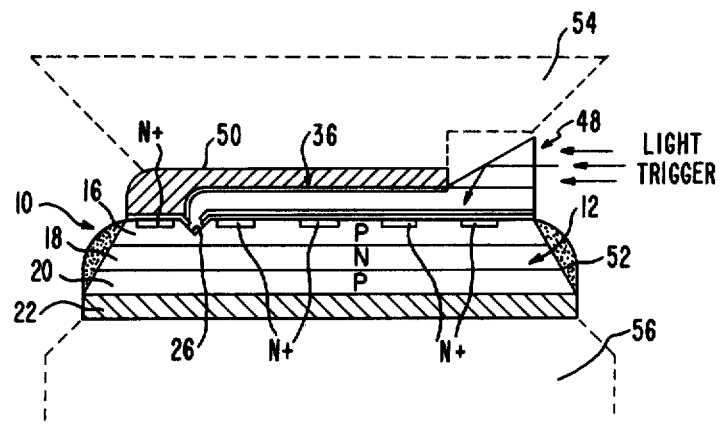
FIG. 2 is a cross sectional view of the LASS taken along the line II—II of FIG. 1, with the metalization shown in place.
Figure 3:
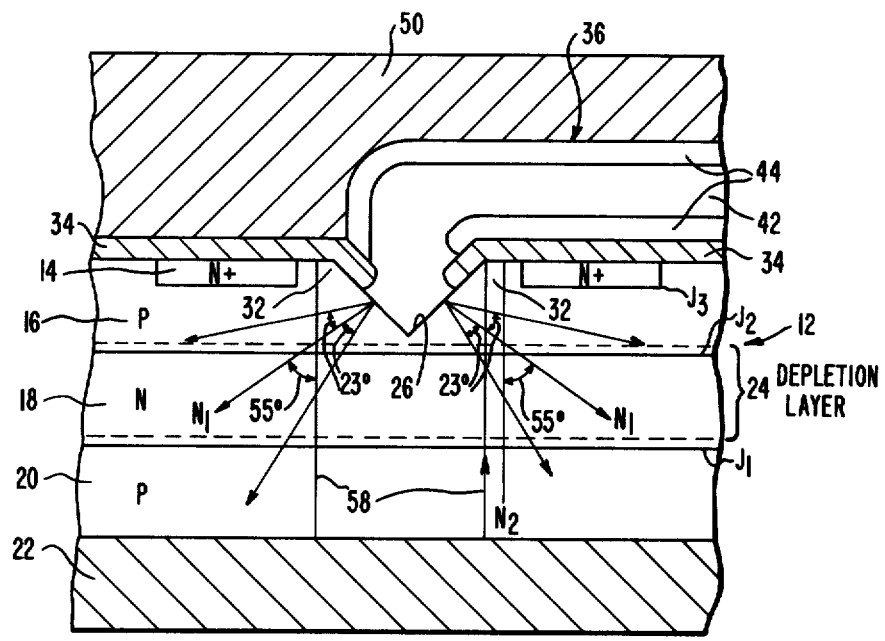
FIG. 3 is a cross sectional view showing a light transmitting conduit optically connected with an optical target in the silicon wafer of the LASS.

Referring now to FIGS. 1, 2 and 3, a light activated silicon switch (LASS) is indicated generally at 10. As best shown in FIG. 3, a silicon wafer identified generally at 12, comprises N and P type conductivity regions in N-P-N-P sequence as shown: cathode-emitter (N+) 14, cathode-base (P) 16, anode-base (N) 18, and anode-emitter (P) 20. The silicon wafer 12 may be manufactured by any suitable method known to those skilled in the art as for example alloying, diffusion and epitaxial growth are all potentially useful methods. Diffusion and epitaxial growth are the most widely used methods. Briefly, in the diffusion process starting with an N type wafer, acceptor atoms are diffused on both sides of the N-type wafer to provide a P-N-P structure. Then donor atoms are diffused into one surface to give the required N-P-N-P configuration. The thicknesses of the various regions are controlled to provide the required voltage and triggering characteristics. The structure of the silicon wafer is well known in the art: see *Thyristor Physics* by Adolph Blicher published by Springer-Verlag New York 1976 at pages 7-8. A metallic member 22 of for example molybdenum, which forms an anode electrode for the LASS device, is affixed to the anode emitter region 20. The LASS has three P-N junctions identified as $J_1$, $J_2$, and $J_3$. When voltage is applied in the forward blocking direction the depletion layer is indicated at 24. The depth of this layer is a function of the voltage conditions and the degree of doping.

A number of targets FIG. 1: 26, 28, 30 are prepared in the cathode-base region 16 in the region of a cathode shunt as 32 (FIG. 3). In the interests of simplicity only three targets are shown in FIG. 1 but in the practical embodiment there will be 1-10 or more, but covering less than 25% of the surface area of the cathode base region 16.

Figure 4:
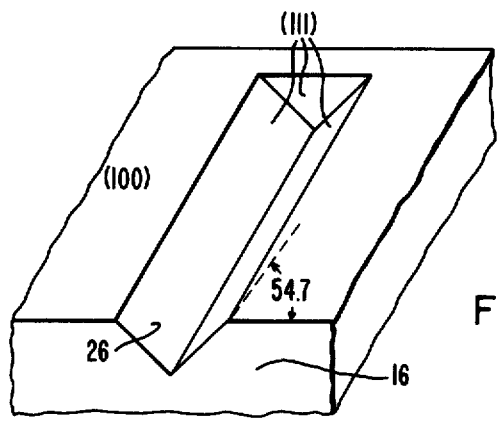
FIG. 4 is an isometric view showing a target channel cut in the cathode base region and, showing three of the four (111) planes after etching.

As best shown in FIG. 4, the target such as 26 is produced by an etchant comprising ethylenediamine 35.1 mole percent, pyrocatechal 3.7 mole percent, and water 61.2 mole percent. The action of this etchant is to rapidly remove silicon material until a particular crystal plane surface is exposed. Specifically, the etchant is used until a (111) crystallographic plane is exposed. Such (111) planes are so disposed in the silicon crystal that etching a (100) oriented silicon surface produces grooves of V-shaped cross section. The V-target 26 is approximately 10-25 microns in depth (well removed from the depletion layer 24) and 100 mils long. The usual thickness of the cathode base region 16 is between 50 and 75 $\mu$meters.

A metallic layer 34 of aluminum or an alloy of titanium, paladium and silver about 5 $\mu$meters thick is plated over the cathode emitter region 14, the plating extending for about 3 microns into the target 26 such as shown in FIG. 3. The purpose of this plating extension is to insure that there is electrical contact up to the edge of the target 26.

Light transmitting conduits indicated generally at FIG. 1: 36, 38, 40 are arranged to contact the targets 26, 28 and 30 respectively. As shown in FIG. 3, the light transmitting conduit 36 comprises a light transmissive core 42, covered by a cladding 44, the cladding being suitably removed at the target where it is desired to deliver the light. Advantageously the core 42 is of flint glass having an index of refraction of 1.6, while the cladding is silicon dioxide. The silicon dioxide, thermally grown, has in index of refraction of 1.42-1.46. The silicon wafer typically has an index of refraction of 3.5. The thickness of the light transmitting conduit 36 is approximately 0.25 $\mu$meters.

One end portion of the light transmitting conduits 36, 38 and 40 terminates at the target area 26, 28, 30 respectively, while the other end portion terminates in a yoke 46 for receiving a light trigger. Overlying the yoke 46 is an optical system indicated generally at 48 for delivering light from a light trigger source (not shown), to the light transmitting conduits 36, 38 and 40, from whence it will be delivered to the targets areas 26, 28, 30. The cladding 44 is appropriately removed from the conduit 36 to permit light to enter the cathode-base region 16. Optical system 48 is here illustrated as a prism which reflects the light rays into the light transmitting conduits. A metallic layer 50 about 50 $\mu$meters thick is plated over the conduits 36, 38, 40, making electrical contact with the cathode electrode 34, but not covering the optical system 48. Typically the layer 50 is of copper, nickel or silver.

Completing the description of the device, passivation for the LASS is identified at 52. The passivation material is an organic silicon resin used to prevent leakage currents on the surface of the silicon wafer, and also to prevent a spurious conductive path from developing between the anode and cathode electrodes. In the commercial package of the LASS 10 it will be mechanically supported on electrical conductors 54 and 56 shown in phantom section in FIG. 2. The light trigger source may be any optical driver which produces light having a wave length of about 1.06 meters. The limits for the light source are in the wave length range approximately 1.00 to 1.10 $\mu$meters. If the wave length is longer than 1.14 $\mu$meters, the light is not absorbed in the silicon wafer. If the wave length is shorter than about 1.0 $\mu$meters it does not penetrate well into the silicon wafer. The choice of wave length within this range i.e. 1.00 to 1.10 $\mu$meters, depends upon several factors including the voltage rating of the device, the particular configuration of the device, and most important, in the present state of the art, what light sources are presently commercially available. Typically, the light source is neodymium:yttrium aluminum garnet (Nd:YAG) laser. The laser source may be beamed directly at the optical system 48 or it may be delivered to the optical system 48 by means of optical fibers or mirrors of a combination of both.

In operation the LASS 10 is arranged so that a light trigger source emits light which is received by the optical system 48 and transmitted to the light transmitting conduits i.e. 36, 38 and 40 from where it then enters the cathode-base region 16 at the target areas 26, 28, 30. As best shown in FIG. 3, the light will enter the silicon $\pm 23°$ from the normal $N_1$ to the sides of the V channel 26, nominally at 55° off the normal $N_2$ to the original surface, giving penetration of light under the metallized layer 34. As a result of this illumination anode to cathode conduction takes place in the place indicated at 58, a highly desired consequence since this is a low resistance path and consequently higher starting currents can be tolerated.

Figure 5:
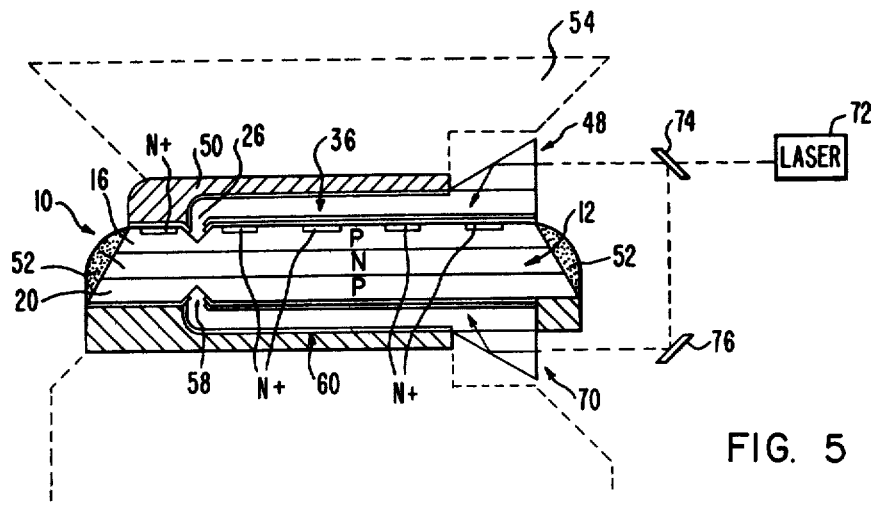
FIG. 5 is a cross sectional view of the LASS in accordance with a second embodiment of the invention.
Figure 6:
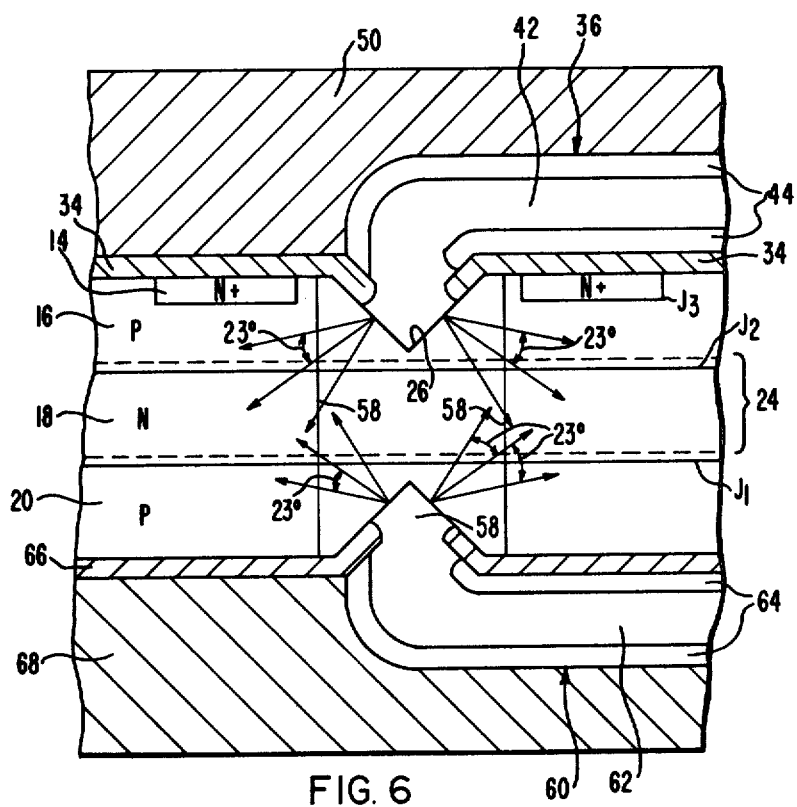
FIG. 6 is a cross section view of the LASS in accordance with a second embodiment of the invention, depicting light transmitting conduits optically connected with target areas in both the cathode-base and anode emitter regions.

In another embodiment of the device, illustrated in FIGS. 5 and 6, light is introduced to both sides of the silicon wafer 12. Since the light which initially enters the silicon wafer 12 is depleted exponentially, as a function of the depth of penetration, the introduction of light from the anode-emitter region 20 will increase the available light in the portions of the regions where it would otherwise be weakened; this dual triggering will insure faster turn on, and more efficient utilization of the available light in many applications.

In order to avoid needless repetition of the identifying numeration, the same numerals have been retained in FIGS. 5 and 6 where the parts are identical to those in the FIGS. 1-4 embodiment.

Referring now to FIGS. 5 and 6, an equal number of targets, i.e. 1 to 10 or more, are prepared in the anode-emitter region 20, the area occupied by all of these targets covering less than 25% of the surface area of the anode-emitter region 20. In the interests of simplicity, only one of the V-shaped targets is shown at 58. These targets are etched in the silicon wafer 12 exactly as described in connection with FIG. 4.

As in the FIGS. 1-4 embodiment, a light transmitting conduit 60 is arranged to contact the target 58. The light transmitting conduit 60 comprises a light transmissive core 62, covered by a cladding 64, the cladding 64 being suitably removed at the end portions respectively, to receive the light trigger and deliver the light at the target 58. The materials for the core 62 and cladding 64 are the same as their counterparts in FIGS. 1-4.

A thin metallic layer 66 of aluminum, or an alloy of titanium, paladium and silver, about 5 μmeters thick, is plated over the anode-emitter region 20, the plating extending into the V-shaped target 58 for about 3 microns such as shown in FIG. 6. A metallic covering 68 of molybdenum is formed over the metallic layer 66 as well as the light transmitting conduits such as 62.

Similarly, as shown in FIG. 1., a plurality of the light transmitting conduits such as 60 are arranged in a yoke which optically communicates with a light prism indicated generally at 70.

Since there are now two optical systems 48 and 70 to which the light must be transmitted, the light source, laser 72, is split by mirrors 74 and 76. The mirror 74 is apertured, so that the laser beam which strikes it is deflected to mirror 76 and then to prism 70. The apertured mirror 74 also reflects the laser beam to the prism 48 as indicated by the dashed lines (unnumbered).

I claim:

1. A light activated silicon switch comprising:
   (a) a silicon wafer having cathode emitter, cathode base, anode base and anode emitter regions;
   (b) a plurality of optical targets, each target comprising a channel etched in only the cathode base region, each of said channels extending from a major surface of said wafer into the cathode-base region to a depth less than the thickness of the region;
   (c) a plurality of light transmitting conduits, each conduit having two end portions, and comprising a central core of light transmitting material surrounded by a cladding, the cladding being removed at one end portion for optically communicating with said channel, the other end portion being adapted to receive a light trigger from a source; and
   (d) anode and cathode electrodes affixed to said anode and cathode emitter regions, said cathode electrode including a portion which extends into said channel.

2. A light activated silicon switch comprising:
   (a) a silicon wafer having cathode emitter, cathode base, anode base and anode emitter regions;
   (b) at least two optical targets, each of said targets comprising a channel, at least one of said targets being disposed in the cathode base region and at least one of said targets being disposed in the anode emitter region, each of said channels extending from a major surface of said wafer into the respective region to a depth less than the thickness of the region;
   (c) at least two light transmitting conduits, each conduit having two end portions and comprising a central core of light transmitting material surrounded by a cladding, the cladding being removed at one end portion for optically communicating with said channel, the other end portion being adapted to receive a light trigger from a source; and
   (d) anode and cathode electrodes affixed to said anode and cathode emitter regions.

3. A light activated silicon switch according to claim 1 wherein;
   said optical targets occupy less than 25% of the total area of the cathode-base and anode-emitter regions respectively, and said channel is V-shaped.

4. A light activated silicon switch according to claim 1 wherein;
   said central core is of flint glass and said cladding is of silicon dioxide.

5. A light activated silicon switch according to claim 1 wherein;
   said cathode and anode electrodes each include an overhang portion which extends partially down into said channel.

* * * * *